(12) United States Patent
Narayanan et al.

(10) Patent No.: US 12,626,032 B2
(45) Date of Patent: May 12, 2026

(54) USING ELEMENTAL MAPS INFORMATION FROM X-RAY ENERGY-DISPERSIVE SPECTROSCOPY LINE SCAN ANALYSIS TO CREATE PROCESS MODELS

(71) Applicant: Applied Materials, Inc., Santa Clara, CA (US)

(72) Inventors: Sundararaman Narayanan, Cupertino, CA (US); Anantha R. Sethuraman, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1200 days.

(21) Appl. No.: 17/447,337

(22) Filed: Sep. 10, 2021

(65) Prior Publication Data

US 2023/0081446 A1 Mar. 16, 2023

(51) Int. Cl.
*G06F 30/20* (2020.01)
*G05B 19/418* (2006.01)

(52) U.S. Cl.
CPC ....... *G06F 30/20* (2020.01); *G05B 19/41875* (2013.01); *G05B 2219/32368* (2013.01)

(58) Field of Classification Search
CPC .............. G06F 30/21; G05B 19/41875; G05B 2219/32368
USPC ........................................................ 703/2
See application file for complete search history.

(56) References Cited

U.S. PATENT DOCUMENTS

2007/0006116 A1 1/2007 Percin et al.
2020/0226742 A1* 7/2020 Sawlani ............ H01L 21/67288

FOREIGN PATENT DOCUMENTS

| | | |
|---|---|---|
| EP | 1182526 A2 | 2/2002 |
| EP | 1218806 B1 | 8/2004 |
| KR | 10-2009-0011596 A | 2/2009 |
| WO | 03-104921 A2 | 12/2003 |

OTHER PUBLICATIONS

Chen_2020 (Detecting and Measuring Defects in Wafer Die Using GAN and YOLOv3, Applied Sciences Dec. 5, 2020). (Year: 2020).*
Choi_2021 (Machine learning-based virtual metrology on film thickness in amorphous carbon layer deposition process, Measurement: Sensors Available Online Apr. 24, 2021). (Year: 2021).*
International Search Report and Written Opinion for International Application No. PCT/US2022/042941, mailed Dec. 16, 2022, 10 pages.

* cited by examiner

*Primary Examiner* — Brian S Cook
(74) *Attorney, Agent, or Firm* — Lowenstein Sandler LLP

(57) ABSTRACT

Implementations disclosed describe a method of using a model to predict a change of a physical state of a sample caused by one or more stages of a technological process in a substrate processing apparatus and obtaining imaging data associated with an actual performance of the one or more stages of the technological process. The imaging data includes a distribution of one or more chemical elements for a number of regions of the sample. The method further includes identifying, based on the imaging data, a difference between the predicted change of the physical state of the sample and an actual change of the physical state of the sample caused by the actual performance of the one or more stages of the technological process. The method further includes determining parameters of the model based on the identified difference.

21 Claims, 6 Drawing Sheets

400

Start

402

Using a model to predict a change of a physical state of a sample

404

Obtaining imaging data

406

Identifying a difference between a predicted change and an actual change of the physical state of the sample

408

Determining parameters of the model based on the identified difference

End

USING ELEMENTAL MAPS INFORMATION FROM X-RAY ENERGY-DISPERSIVE SPECTROSCOPY LINE SCAN ANALYSIS TO CREATE PROCESS MODELS

TECHNICAL FIELD

This instant specification generally relates to ensuring quality control of materials manufactured in substrate processing systems. More specifically, the instant specification relates to using distribution of chemical elements obtained from x-ray imaging data to create and optimize accurate process models.

BACKGROUND

Manufacturing of modern materials often involves various deposition techniques, such as chemical vapor deposition (CVD), physical vapor deposition (PVD), or Atomic Layer Deposition (ALD) techniques, in which atoms of one or more selected types are deposited on a substrate (wafer) held in low or high vacuum environments that are provided by vacuum deposition chambers. Materials are also created by surface treatment of a deposited film with exposure to Oxygen and Nitrogen to create thin films. Materials manufactured in this manner may include mono-crystals, semiconductor films, fine coatings, and numerous other substances used in practical applications, such as electronic device manufacturing. Because manufacturing of complex substrates can be a costly and time-consuming process, testing of various processing techniques and systems is often supplemented with modeling.

SUMMARY

A method and a system for using elemental maps to create process models. The method includes using a model to predict a change of a physical state of a same caused by stages of a technological process in a substrate processing apparatus. The method further includes obtaining imaging data associated with an actual performance of the stages of the technological process. The imaging data includes a distribution of chemical elements for regions of the sample. The method further includes identifying, based on the imaging data, a difference between the predicted change of the physical state of the sample and an actual change of the physical state of the sample caused by the actual performance of the stages of the technological process. The method further includes determining parameters of the model based on the identified difference.

DETAILED DESCRIPTION

Figure 1:
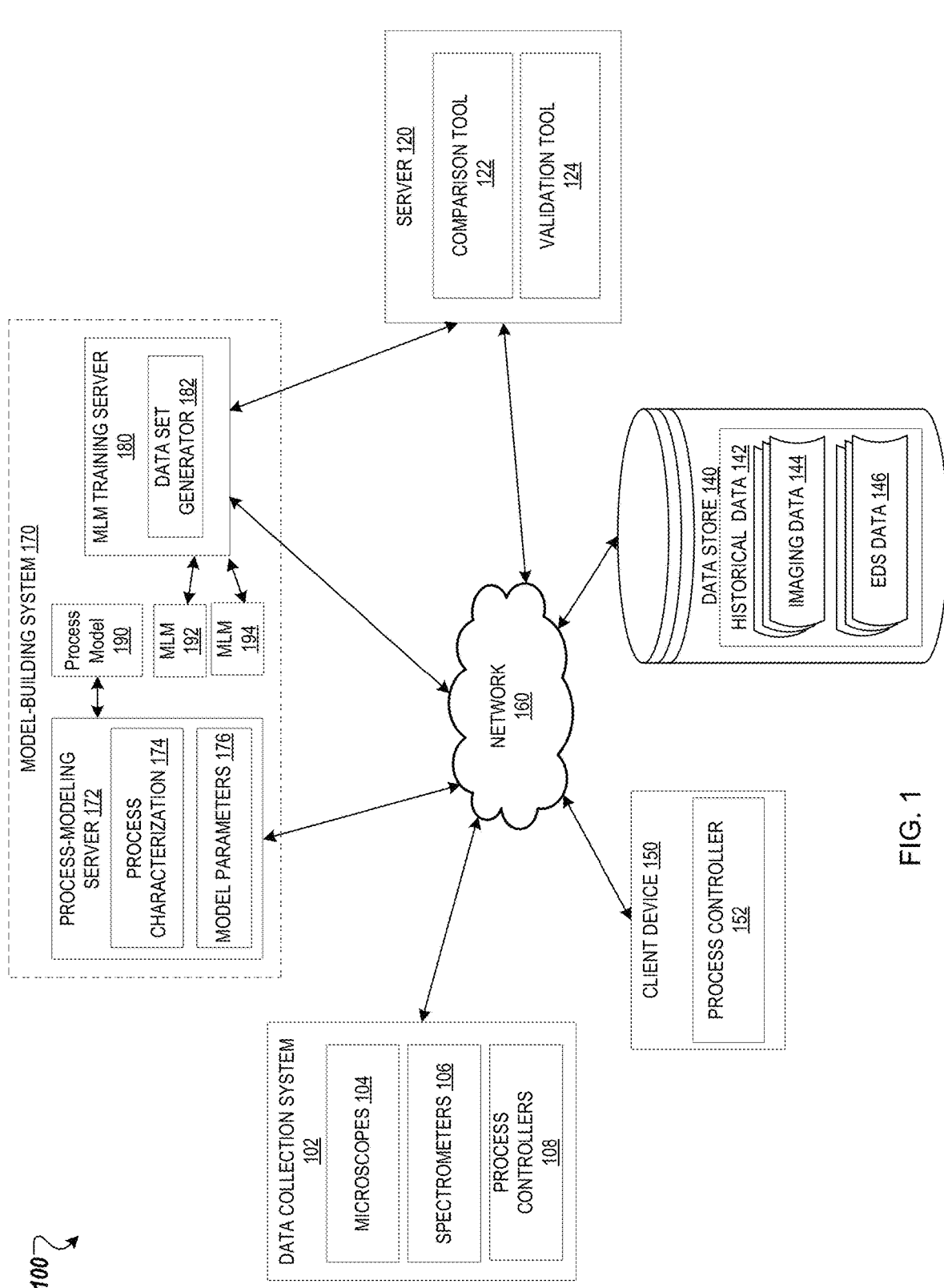
FIG. 1 is a block diagram illustrating an exemplary system architecture in which implementations of the disclosure may operate.

Accuracy and uniformity of manufacturing applications depend on the ability of a model to predict realistic changes to a sample due to various processing operations. Parameters of the model should be determined based on observations of actual changes to the sample such that the model can be updated to more accurately predict changes to a different sample or for a different processing operation. The embodiments disclosed herein provide systems and methods for using element maps to create process models. In fabrication of samples (e.g., micro-fabrication, wafer manufacturing, substrate generation, and/or the like), various processing tools and procedures are used to create a desired outcome (e.g. a sample meeting a desired specification or having desired properties). Fabrication processes may include various processing operations, such as material deposition, material etching, polishing, etc. For example, a deposition operation may include placing (depositing) one or more materials directly onto a substrate or onto a different material, previously deposited onto the substrate. Quality of the manufacturing yield depends on the ability to determine (or predict) a thickness of the deposited layer under specific manufacturing conditions. Determining the thickness is often done using models or predictions based on various factors, such as expected deposition rate, type of the deposited material(s), temperature and pressure maintained within the processing chamber, type and quality of the substrate, etc. Existing methods of generating these models typically rely on parameters that are extracted from transmission electron microscopy (TEM) images or scanning electron microscopy (SEM) images. However, TEM and SEM images provide a limited amount of information about electron flux generated by various locations of the sample, but do not directly indicate the type of atoms at those locations and, therefore, may not accurately reflect reaction fronts and interfaces between subsequent layers. Similarly, an etching operation (e.g., that deploys halogen agents) may lead to a small amount of etching material penetrating into unintended regions of the sample (referred to as halide inclusion). However, the remaining halogens are typically present in smaller quantities than the sample material, and thus may be poorly visible on a TEM or SEM image.

In both the cases of deposition and etching, conventional models for predicting how the sample is affected or changed by processing often depend on parameters extracted from the TEM or SEM images. These parameters may not reflect accurately an amount (e.g., density) of specific elements at any given point of the sample. Therefore, models that are generated or developed using these parameters may sometimes lack a desired accuracy, especially in cases for which deposited layers are very thin; or if there is an interface layer formed between deposited layers; the substrate or deposition surface is rough, has trenches, or has a sufficiently large curvature; when there is halide inclusion; or the like. So although models may be generated, the accuracy of the models may be limited, and validating the models using parameters extracted from TEM or SEM data may not improve their accuracy that is inherently limited by the character of TEM and/or SEM imaging.

Aspects and implementations of the present disclosure address these and other shortcomings of existing methods by using x-ray energy-dispersive spectroscopy (EDS) data to build and/or validate process models for more accurate predicted changes in physical states of samples caused by various technological processes or processing operations. EDS provides information about local distributions of various chemical elements (e.g., for multiple elements of interest), often referred herein to as element density maps of the sample. In some implementations, EDS data may specify element densities for each pixel (or a plurality of pixels) of an image of a sample. Process models developed and calibrated using detailed EDS data obtained for some specific processing operations have high predictive ability even when extended for other processing operations, for which detailed measurement data may be absent, difficult, or expensive to obtain.

Aspects and implementations of the present disclosure describe system and methods for obtaining information of reaction fronts, etch fronts, interfaces, undercuts in thin films that are present after etching processes, halide inclusion, deposition on rough, curved, or trenched surfaces, unstable states of materials, and the like by using EDS data. Such methods allow for determining film thickness to a high degree of accuracy, even in cases in which the film is very thin (e.g., on the order of ten angstroms (Å)) and is deposited on a surface with roughness feature profiles that are comparable in height to the film thickness (e.g., on the order of 5 A). Additionally or alternatively, such methods allow for determining a degree to which halogens penetrate sidewalls or other regions of the sample during etching processes. Additionally or alternatively, such methods allow for obtaining information about interfaces between a layer and another layer or the substrate, such as whether there is oxidation or nitridation, if there are unexpected nucleation effects, etc. Aspects of the present disclosure provide methods for creating and/or validating process models by using information obtained from EDS data.

FIG. 1 is a block diagram illustrating an exemplary system architecture 100 in which implementations of the disclosure may operate. As shown in FIG. 1, system architecture 100 includes a data collection system 102, a client device 150, a data store 140, a server 120, and a model-building system 170. The model-building system 170 may be part of the server 120. In some embodiments, one or more components of the model-building system 170 may be fully or partially integrated into client device 150. The data collection system 102, the client device 150, the data store 140, the server 120, and the model-building system 170 may each be hosted by one or more computing devices including server computers, desktop computers, laptop computers, tablet computers, notebook computers, personal digital assistants (PDAs), mobile communication devices, cell phones, hand-held computers, or similar computing devices.

The data collection system 102, client device 150, data store 140, server 120, and model-building system 170 may be coupled to each other via a network 160 (e.g., for performing methodology described herein). In some embodiments, network 160 is a private network that provides each element of system architecture 100 with access to each other and other privately available computing devices. Network 160 may include one or more wide area networks (WANs), local area networks (LANs), wired network (e.g., Ethernet network), wireless networks (e.g., an 802.11 network or a Wi-Fi network), cellular network (e.g., a Long Term Evolution (LTE) network), routers, hubs, switches, server computers, and/or any combination thereof. Alternatively or additionally, any of the elements of the system architecture 100 may be integrated together or otherwise coupled without the use of network 160.

The client device 150 may be or include any personal computers (PCs), laptops, mobile phones, tablet computers, netbook computers, network connected televisions ("smart TV"), network-connected media players (e.g., Blue-ray player), a set-top-box, over-the-top (OOT) streaming devices, operator boxes, etc. The client device 150 may include a browser, an application, and/or other tools as described and performed by other systems of the system architecture 100. In some embodiments, the client device 150 may be capable of accessing the data collection system 102, data store 140, server 120, and/or model-building system 170 and communicating (e.g., transmitting and/or receiving) process operation controls, data (such as image data 144 and/or EDS data 146) from data store 140, and/or inputs and outputs of various process tools (e.g., comparison tool 122, validation tool 124, and/or process model 190) at various stages processing of the system architecture 100, as described herein.

As shown in FIG. 1, data collection system 102 includes microscopes 104, spectrometers 106, and process controllers 108. Microscopes 104 and spectrometers 106 may be used by the data collection system 102 and/or a corresponding data collection tool (such as an ion beam spectrometer, etc.). In some embodiments, microscopes 104 include a TEM or a SEM. In some embodiments, spectrometers 106 include an x-ray spectrometer. The data collection system 102 further includes process controllers 108 that coordinate actions to be performed by microscopes 104 and spectrometers 106. The coordinated action may be associated with altering process operations performed on the sample based on data (such as imaging data 144 and EDS data 146 stored on the data store 140) or building a model based on the data. Process controllers 108 may receive input from other components (e.g., model-building system 170, server 120, etc.) of system architecture 100 to perform the above-described actions.

Model-building system 170 may include a process-modeling server 172 to build a process model 190. In some embodiments, process-modeling server 172 may include process characterization 174. Process characterization 174 may be a module that describes various physical and chemical processes occurring during manufacturing operations being modeled, such as speed of deposition, etching, polishing, etc. Process characterization 174 may be based on various conditions, such as density of a plasma, chemical composition of the plasma, temperature and pressure of the environment of the manufacturing chamber, pressure applied to a polishing device, and the like. Additionally or alternatively, process characterization 174 may be based on changes to external conditions, such as introduction and/or replacement of transfer chambers, robotic parts, optical measurement devices, and the like. In additional embodiments, process characterization 174 may depend on input parameters that may be derived from prior process characterizations. For example, in some cases, process characterizations may be based on results, such as deposition rate, specific materials, chamber environment, that are derived from static models. Such static models may be adjusted or updated to fit to the process characterizations.

Process characterization 174 may use model parameters 176 that relate physical and chemical conditions of the manufacturing chamber and the technological operations performed therein to the output of the manufacturing. For example, one set of model parameters 176 may relate speed of deposition of a particular material to the density of that material in the chamber, the temperature and pressure in the chamber, to the type of the substrate, and the quality of the surface of the substrate. Another set of model parameters 176 may relate the speed of etching to the density and flux of halogens directed to the substrate. Yet another set of model parameters 176 may relate speed of material removal to the type of the material, pressure applied to the removal tool, speed of operation of the removal tool, and so on. As described in more detail below, process modeling server 172 may determine (and/or adjust) model parameters 176 for process model 190 using EDS data obtained for one or more substrates during actual substrate processing. Process characterization 174 of model parameters 176 may be used to generate process model 190. In some embodiments, process model 190 may predict outcomes of process operations based on process characterization of model parameters. A first machine-learning model may be implemented to classify the predicted outcomes of process models based on whether or not the results are realistic/accurate and based on their deviation from realistic/accurate data. In some embodiments, process model 190 may be further based on results of a second machine-learning model, which may be used as inputs to process model 190. In some embodiments, the first machine-learning model may be applied at the output of process model 190 and the second machine learning model may be applied as the input of process model 190 as described further below.

Process controllers 108 may include devices designed to manage and coordinate the actions of microscopes 104 and/or spectrometers 106. In some embodiments, process controllers 108 are associated with causing spectrometers 106 to obtain EDS data in correspondence with microscopes 104 obtaining imaging data (such as a TEM image or an SEM image). For example, each EDS data point may correspond to a pixel of a microscope image, such that an element-specific density map may be obtained in reference to the microscope image.

In some embodiments, machine-learning model (MLM) 192 may be a machine-learning model trained by MLM training server 180. MLM training server 180 may include one or more computing devices (such as a rackmount server, a router computer, a server computer, a personal computer, a mainframe computer, a laptop computer, a tablet computer, a desktop computer, etc.), data stores (e.g., hard disks, memories databases), networks, software components, or hardware components. For training of MLMs 192 and/or 194, MLM training server 180 may use data stored in a data store 140. Data store 140 may be a memory (e.g., random access memory), a drive (e.g., a hard drive, a flash drive), a database system, or another type of component or device capable of storing data. Data store 140 may store one or more historical data 142 including imaging data 144 (e.g., as obtained by microscopes 104) and/or EDS data 146 (e.g., as obtained by spectrometers 106) of physical changes of previous samples subjected to process operation(s). In some embodiments, the historical data 142 may be used to train, validate, and/or test MLMs 192 and/or 194.

The one or more trained machine-learning models, e.g., MLM 192, may be used in conjunction with process model

190. In some embodiments, EDS data may be input into MLM 192 that is trained using historical data 142 that include EDS data 146 from previously performed technological operations. The (new) EDS data may first be input into MLM 192 to obtain a reliability classification of the EDS data before the EDS data is used to adjust process model 190. In some instances, the trained MLM 192 may classify the EDS data as expected data, which may indicate that the EDS data is consistent with what previously developed process model 190 is likely to predict. In such instances, process-modeling server 172 may skip modifying process model 190 based on the EDS data. In some instances, the trained MLM 192 may classify the EDS data as unexpected data, which may indicate that the currently available process model 190 is likely unable to account for the obtained EDS data without adjustment. In such instances, process-modeling server 172 may initiate adjustment of process model 190, e.g., by modifying model parameters 176 of process model 190 based on the EDS data. Finally, in some instances, the trained MLM 192 may classify the EDS data as highly unexpected, which may indicate that the currently available process model 190 is likely unable to account for the obtained EDS data even after model parameters 176 are adjusted. This may signal to a model user or developer that process model 190 may have to undergo a more significant revision, e.g., by including modeling of some physical processes and/or conditions that have previously been neglected in process model 190.

Trained MLM 192 may classify (new) EDS data as expected, unexpected, or highly unexpected based on various set thresholds. In some embodiments, an element density for a particular element at a particular point may for the new EDS data and the historical EDS data. If the element densities differ by a first threshold value, the new EDS data may be classified as unexpected; if the element densities differ by a second threshold value greater than the first threshold value, the new EDS data may be classified as highly unexpected. In other embodiments, other features, such as surface features, element densities for multiple elements, etc. may be used alone or in conjunction wither any other criteria.

In some embodiments, a trained MLM 194 may be applied to validate predictions of process model 190 (including modified or adjusted process model 190). More specifically, after process model 190 is used to predict how a particular technological process is to take place (including a duration of the process, output of the process, etc.), the prediction output of process model 190 may be input into an MLM 192 that is trained on previous outputs of process model 190. The trained MLM 192 may classify the output of process model 190 as either realistic or unrealistic. The output of process model 190 may be compared to previous outputs of process model 190, and if the discrepancies are above a threshold condition the result may be classified as unrealistic, while if the discrepancies are below the threshold condition, the result may be classified as realistic. The threshold condition may be any comparable quantities, such as, one or more of deposition thickness, deposition rate, etch rate, interface formations, etc. For example, in one embodiment, historical predictions of process model 190 may predict a formation of an interface layer for a technological process, while a (new) prediction of process model 190 may predicted a formation of an interface layer for the same technical process that is significantly thicker; a comparison may include comparing thickness, composition, etc, and a determination may be made as to whether the (new) prediction is realistic or unrealistic.

If the output is classified as unrealistic (e.g., the output may differ from previous outputs by a threshold amount), the process-modeling server 172 may adjust (e.g., automatically, without an input from a developer) model parameters 176 of process model 190. A new output of process model 190 may then be obtained and a new prediction by process model 190 may be processed by the MLM 192. If multiple automatic attempts to adjust model parameters 176 are classified as unrealistic, process-modeling server 172 may stop further modification of process model 190 and seek the developer's input. The developer may then incorporate modeling of some additional (previously neglected) physical processes and/or conditions into an updated process model 190. In some embodiments, both MLM models 192 and 194 may be used with process model 190, for example, the EDS data-processing MLM may be used prior to process model 190 and the prediction-processing MLM may be applied to an output of process model 190.

Server 120 may include one or more computing devices such as a rackmount server, a router computer, a server computer, a personal computer, a mainframe computer, a laptop computer, a tablet computer, a desktop computer, etc. The server 120 may include a comparison tool 122 and a validation tool 124.

The comparison tool 122 may obtain EDS data, for example, from spectrometers 106, that is representative of imaging data associated with performance of a processing operation (such as deposition, etching, and the like) on the sample (referred to as measured data), as well as data corresponding to a predicted physical change to the sample corresponding to the processing operation (referred to as predicted data). In some embodiments, the predicted data is generated by the process model 190. In other embodiments, the predicted data may be generated from a different model or calculation(s). The processing operation may include one or more operations/stages of a technological process (such as would occur in wafer or sample manufacturing) that occur in a processing chamber. The comparison tool 122 identifies differences and/or discrepancies between the measured data and the predicted data, and may use or provide the differences to the model-building system 170.

The validation tool 124 may validate the process model 190. Based on the differences as provided to the model-building system 170 by the comparison tool 122, the validation tool 124 may generate or update the process model 190 and/or determine parameters of the process model 190. In some embodiments, in addition to the differences, the model-building system 170 may use other data such as temperatures, pressures, processing chamber environment conditions, etc., in addition to the differences to build and/or determine parameters of the process model 190. In some embodiments, the validation tool 124 may validate modeled data that has been used to generate the process model 190. The process model 190 may be generated at least in part using historical data 142. In some embodiments, the validation tool 124 may use model-building system 170 to train MLM 192. For example, the machine learning model may be trained using supervised learning with the historical data 142. MLM 192 may include a decision tree such a random forest that evaluates features (e.g., variable, factors, and/or parameters associated with a technical process operation on the same) to predict a change of a physical state of the sample.

As previously described, some embodiments of the comparison tool 122 and the validation tool 124 may perform their described methodology using MLM 192, MLM 194, or another machine-learning model. The associated machine learning models may be generated (e.g., trained, validated, and/or tested) using model-building system 170 and/or MLM training server 180. However, it should be noted that this description is purely exemplary. Analogous processing hierarchy and methodology may be used in the generation and execution of machine learning models associated with the comparison tool 122 and the validation tool 124 individually and/or in combination with each other, as will be discussed further in association with other embodiments.

The model-building system 170 may include one or more computing devices such as a rackmount server, a router computer, a server computer, a personal computer, a mainframe computer, a laptop computer, a tablet computer, a desktop computer, etc. In some embodiments, the model-building system 170 may use historical data 142 to determine parameters of the process model 190 based on identified differences between predicted results and measured results.

MLM training server 180 may include a data set generator 182 that is capable of generating data sets (e.g., a set of data inputs and a set of target outputs) to train, validate, or test a machine learning model. The data set generator 182 may partition the historical data 142 into a training set (e.g., sixty percent of the historical data, or any other portion of the historical data), a validating set (e.g., twenty percent of the historical data, or some other portion of the historical data), and a testing set (e.g., twenty percent of the historical data). For example, one or more sets of training data may include each of the data sets (e.g., a training set, a validation set, and a testing set).

For purposes of illustration, rather than limitation, aspects of the disclosure describe the training of a machine learning model and use of a trained learning model using information pertaining to historical data 142. In other implementation, the process model 190 may be a heuristic model or rule-based model.

In some embodiments, the functions of client devices 112, server 120, data store 140, and model-building system 170 may be provided by a fewer number of machines than shown in FIG. 1. For example, in some embodiments process-modeling server 172 and MLM training server 180 may be integrated into a single machine, while in some other embodiments, process-modeling server 172 and MLM training server 180 may be integrated into a single machine. In some embodiments, the model-building system 170 may be fully or partially provided by server 120.

In general, functions described in one embodiment as being performed by client device 150, data store 140, metrology system 110, cell cultivation system 102, and model-building system 170 may also be performed on server 120 in other embodiments, if appropriate. In addition, the functionality attributed to a particular component may be performed by different or multiple components operating together.

In embodiments, a "user" may be represented as a single individual. However, other embodiments of the disclosure encompass a "user" being an entity controlled by multiple users and/or an automated source. For example, a set of individual users federated as a group of administrators may be considered a "user."

Figures 2, 3A:
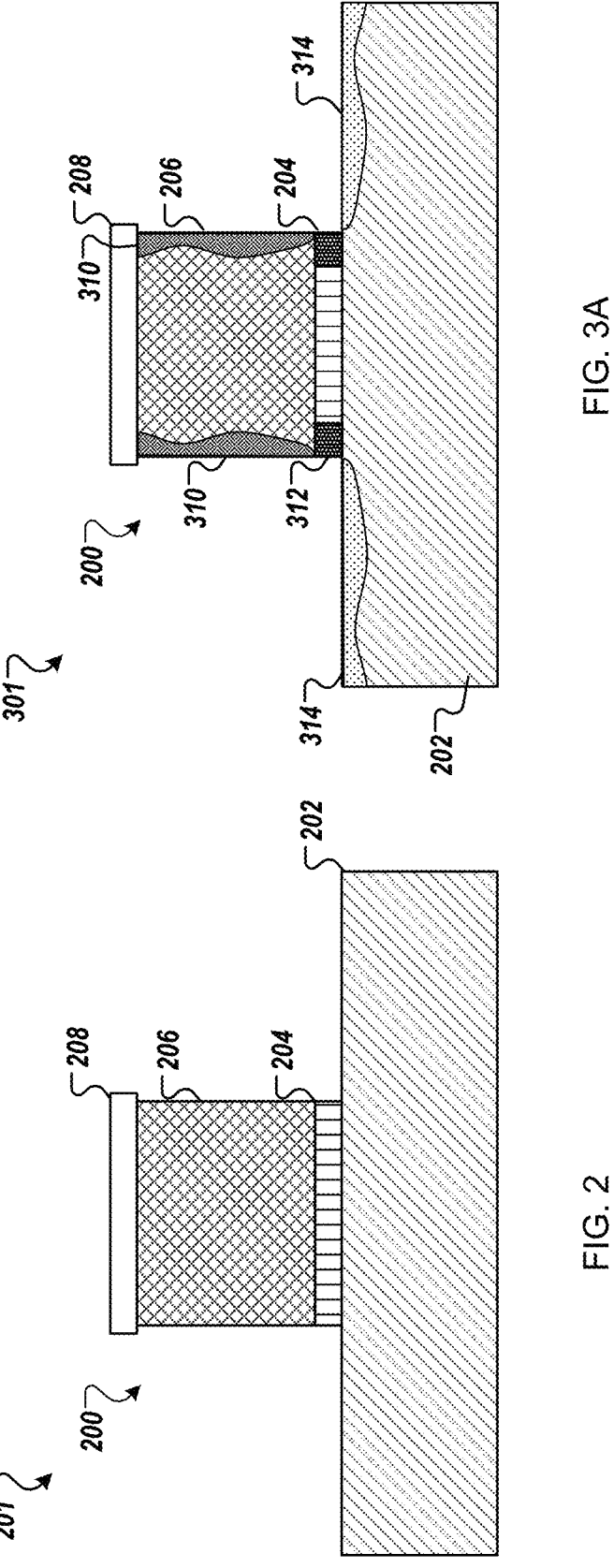
FIG. 2 is a schematic transmission electron microscopy (TEM) image of a sample, according to one embodiment.
FIG. 3A is a schematic x-ray energy-dispersive spectroscopy (EDS) image of the sample, according to one embodiment.

FIG. 2 is a schematic TEM image 201 of a sample 200, according to one embodiment. The sample 200 includes a substrate 202 (e.g., a silicon substrate, a silicon carbide substrate), a dielectric layer 204 (e.g., a silicon dioxide layer), a metal film 206 (e.g., a silver or copper film), and a mask 208 (e.g., a hard (silicon oxide, silicon nitride, etc.) mask, a polymer mask, or other type of suitable mask, etc.).

The sample 200 may be a sample that has undergone a change of its physical state due to one or more process operations, such as deposition and/or etching. In some embodiments, the substrate 202 may be placed or located in a processing chamber, a transfer chamber, an etch chamber, a deposition chamber, or any other suitable chamber where the process operation may occur. There may be a dielectric layer 204 on the substrate. In some embodiments, dielectric layer 204 may be formed due to oxidation. Additionally or alternatively, the dielectric layer 204 may be deposited on the substrate 202. A metal film 206 may be deposited on the dielectric layer 204. In some embodiments, a hard mask, such as the mask 208 may be placed or deposited on a portion of the metal film, such as represented by the metal film 206, in the case for which the sample 200 is to be etched, such that only the metal film 206 is remaining.

In some embodiments, an etching process includes use of halogen gases (e.g., chlorine, fluorine, bromine, etc.). The sample 200 would then undergo a post-etch cleaning process to remove residual etching material. However, in some cases, the post-etch cleaning process does not remove all of the residual etching material, which may result in halide inclusion on the sidewall of the sample 200 (e.g., on the sides of the metal film 206). Halide inclusion, or the presence of one or more halide gases in the metal film 206, may affect device performance, contact resistance, and other physical properties. Residual halogens may become volatile and escape during subsequent processing operations, which may involve bringing the sample 200 to a high temperature, a low pressure, or the like. For example, titanium nitride (TiN) may be etched with a halogen gas. The TiN sidewall (e.g., a metal layer) may then include the halogen gas(es) used for etching. In general, after etching, the metal film 206 may include some residual halogens, such that the sidewalls of the metal film 206 itself may include a small percent (e.g., up to approximately 10%) of the etch material. However, such halide inclusion may not be apparent on a TEM image, as the bulk of the material is still the metal.

In some instances, the substrate 202 may be damaged during the etching process. In such cases, the etching material may penetrate into the upper surface of the substrate 202 that is exposed to the etching material. Similarly, the edges of the dielectric layer 204 that are exposed to etching material may also be damaged. In each of these cases, the etching material, which is present in the substrate 202 (and/or the dielectric layer 204), is present in sufficiently small percentages that its presence may not be apparent in a TEM image.

The sample 200 is depicted for illustrative and exemplary purposes. The methods of creating process models using EDS line scans described in this disclosure are applicable to other samples with different structures (e.g. having more or fewer layers), and to other semiconductor wafers.

FIG. 3A is a schematic EDS image 301 of the sample 200, according to one embodiment. EDS data may be used for chemical analysis and may provide information about elemental presence at any given location on the sample. EDS relies on specific interactions of x-rays with different elements. In the illustrated case, EDS data provides information about a distribution of chemical elements across the sample.

In particular, EDS data may be rendered as EDS image 301 and may provide information about halide inclusion in regions 310, dielectric undercut in regions 312, and etch damage in regions 314. Because EDS data may provide additional and more accurate information compared to TEM data.

Accuracy of a manufacturing process for the sample 200 (or any other sample) may rely on one or more models that predict changes in the physical state of the sample 200 that are caused by one or more process operations within a processing chamber. For example, a model may predict a deposited film thickness based on the type of material being deposited, the duration of time during which the material is being deposited, the environment of the processing chamber, etc. Similarly, the same model or a different model may predict how much material is removed by etching based on the material being etched, the etching material, the duration of the etching process, the environment of the processing chamber, etc. Such models typically used microscopy data (e.g., TEM or SEM data) as starting points to build these predictive models. Such models, as described may be updated by predicted data that have been generated by machine learning models, such as MLM 192 and/or 194 of FIG. 1. For example, MLM 194 may be used to output microscopy data in addition to historical microscopy data to adjust parameters of these predictive models. MLMs can be implemented using any appropriate software, e.g., scripts in Python, Java, C/C++, or any other suitable programming language.

Because, in many cases, a TEM image is rendered as a grayscale image, it may not provide sufficient information to accurately build a predictive model. For example, such cases may involve i) thin films (e.g., on the order of a few A), ii) halide inclusion, iii) rough surfaces, among other possibilities. Although the three listed cases are used as examples, there may be additional situations in which TEM images may not provide sufficient information to accurately build a predictive model.

As a first example, a deposition rate for a given material and a certain environment of the processing chamber may be determined by depositing a film of the material (e.g., on the order of a few hundred angstroms) and inspecting the resulting TEM image. Such information may be used to build a predictive model for deposition of the material for subsequent samples. When a thin layer of the material is deposited on a subsequent sample in the same environment, the deposition rate may be used to determine the duration of time that the material should be deposited to obtain a desired thickness. In such a case, it is often assumed that the deposition rate is constant. Often, the deposition rate is not constant over a duration of the deposition process. For example, at the start of the process, deposition rate may be low; with time, the deposition rate may increase and may further change near the end of the deposition. In such cases, when the desired thickness is sufficiently thin (e.g., on the order of a few angstroms to tens of angstroms), the assumption that the deposition rate (e.g., as determined from deposition time of thick films) is constant may not be very accurate for thin films. In addition, the deposition process may depend on an interaction between the deposited material and the base material (onto which the deposited material is being deposited). When the desired thickness is sufficiently thin, a TEM image may not have the resolution to provide information about inaccuracies of the predictive model.

On the other hand, because EDS provides individual element density at each point of the sample (e.g., via an intensity measured for each different chemical element), there is a substantial advantage in using the elemental density, e.g., as provided via raw EDS data. The raw EDS data may be analyzed to determine a thickness of the deposited material (with a resolution of a few angstroms). Further, because the raw EDS data provides individual elemental information, even very thin oxidation layers may be detected by spikes in oxygen peaks. In a similar manner, when a surface for deposition is rough (profile features on the order of deposited layer thickness, such as peaks and/or trenches), or has a large curvature, EDS data allows for distinguishing between surface features and deposited material.

Further, raw EDS data may provide information about halide inclusion by presenting peaks for respective halogen gases when scanning the metal layer, thus revealing the presence of halides (e.g., regions 310) within the metal. Raw EDS data may provide information about etch damage (regions 314) in the substrate 202.

Figure 3B:
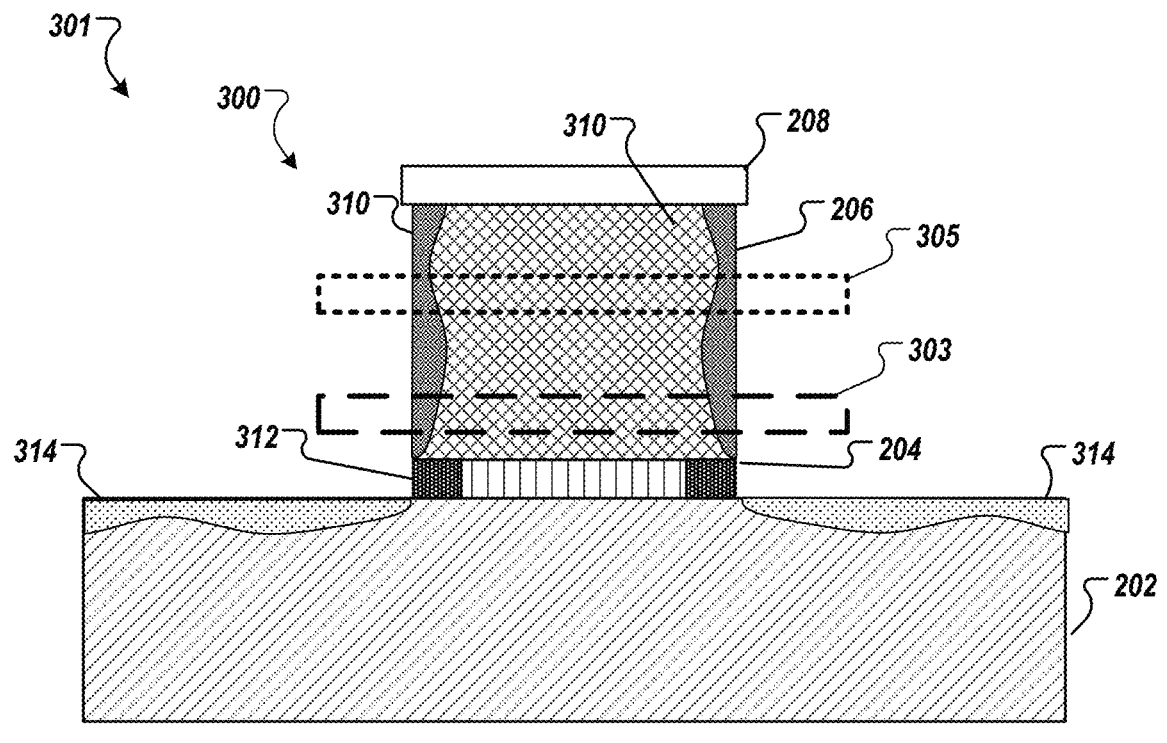
FIG. 3B is the schematic EDS image of the sample as shown in FIG. 3A with rectangular scan regions that are parallel to the surface of the sample, according to one embodiment.

FIG. 3B is the schematic EDS image 301 of the sample 200 as shown in FIG. 3A with rectangular scan regions 303 and 305 parallel to the surface of the sample 200, according to one embodiment. Rectangular scans that are parallel to the surface of the sample 200 may be taken to obtain a graphical representation of element distribution as a function of distance (in this case, distance along the surface of the sample 200). In particular, the distribution may be representative of an element density. Such scans may be used to obtain information about element distribution across the surface of the sample at any height above the sample. For example, rectangular scans parallel to the surface of the sample may be used to probe for halide inclusion, dielectric undercut, and the like.

As a way of example, the rectangular scanning region 303 may scan the sample 200 at a first height above the surface of the substrate 202. This scan may reveal the presence of the metal film 206 as well as halide inclusion in regions 310. Similarly, the rectangular scan region 305 may scan the sample 200 at a first height above the surface of the substrate 202 and also reveal the presence of the metal film 206 as well as the halide inclusion in the regions 310. Between the two scan regions 303 and 305, the halide inclusion may be non-uniform, as shown in FIG. 3C below.

Although FIG. 3B is depicted as having two rectangular scanning regions, any number of scanning regions may be taken (e.g., the rectangular scanning regions may start either at the bottom of the substrate 202 or the top of the substrate 202 and stepped upwards until the entire sample 200 is scanned; the rectangular scanning regions may start at the top of the sample 200 and stepped downwards; the scans may be scanned such that the top/bottom edge of each rectangular scanning region is aligned with the bottom/top edge of each subsequent scanning region; the rectangular scanning regions may overlap or there may be gaps between subsequent scanning regions; or the like).

Figure 3C:
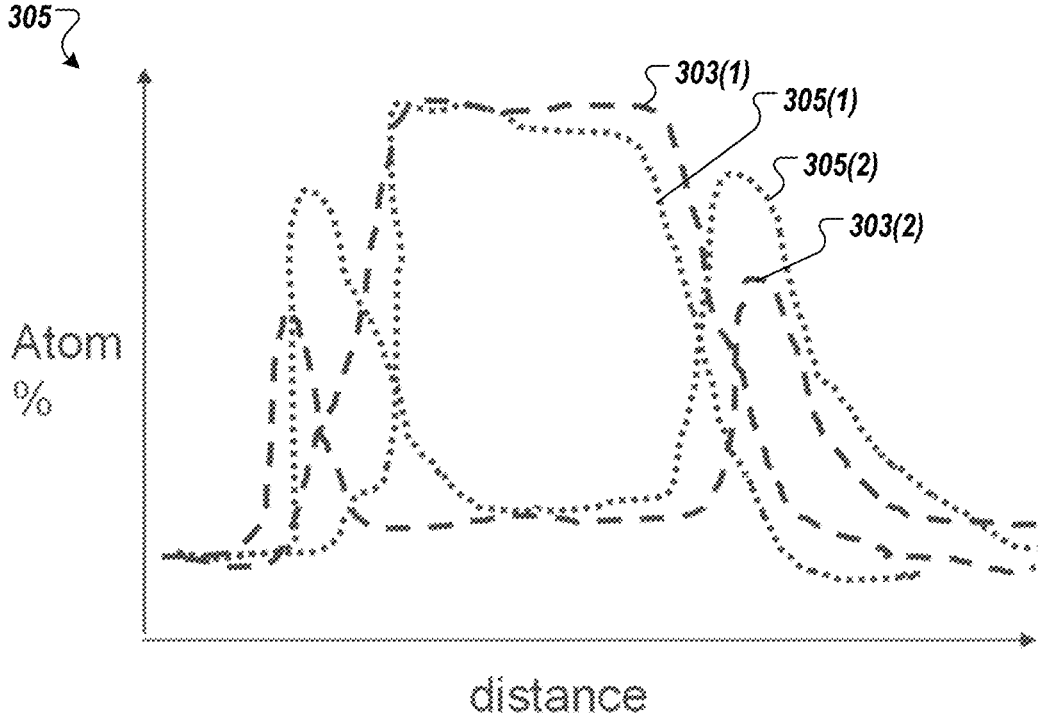
FIG. 3C is a graph illustrating an atom density of various elements present in the sample for the rectangular scanning regions of FIG. 3B, according to one embodiment.

FIG. 3C is a graph illustrating an atom density of various elements present in the sample 200 for the rectangular scanning regions 303 and 305 of FIG. 3B, according to one embodiment. Lines 303(1) and 303(2) correspond to a scan from the rectangular scanning region 303. Lines 305(1) and 301(2) correspond to a scan from the rectangular scanning region 305.

Lines 303(1) and 305(1) correspond to the metal of the metal film 206. Lines 303(2) and 305(2) correspond to the halogen(s) (e.g., fluorine, chlorine, bromine, iodine, or astatine, corresponding to regions 310) present within the sidewalls of the metal film 206 due to halide inclusion. For any given line, a thickness of the corresponding material may be accurately estimated as the full width at half max (FWHM) thickness.

It should be noted that the width (in this case, measured perpendicular to the surface of the sample) should be set based on specific characteristics of the sample. For example, a width that is too large may result in poorer resolution, while a width that is too narrow may result in excessively spurious scans.

Figure 3D:
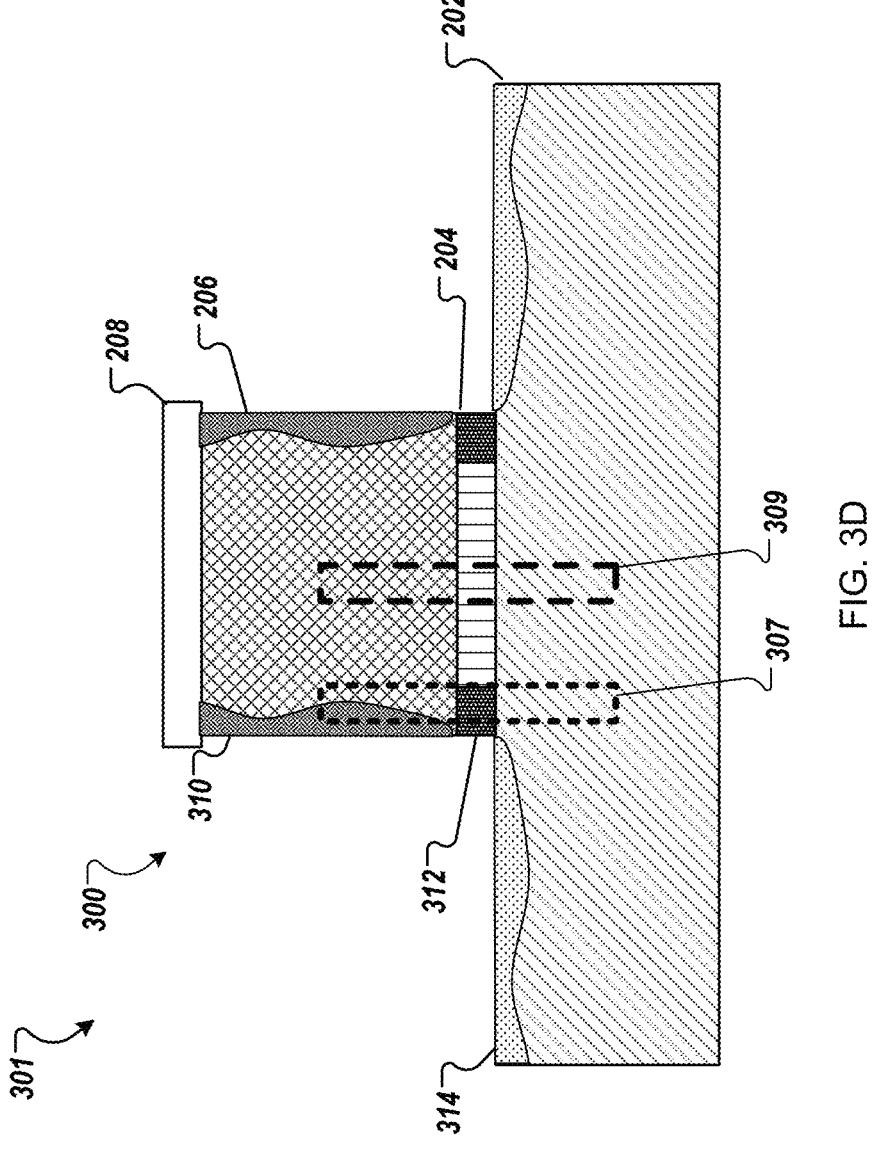
FIG. 3D is the schematic EDS image of the sample as shown in FIG. 3A with rectangular scan regions that are perpendicular to the surface of the sample, according to one embodiment.

FIG. 3D is the schematic EDS image 301 of the sample 200 as shown in FIG. 3A with scan regions 307 and 309 perpendicular to the surface of the sample 200, according to one embodiment. Rectangular scans that are perpendicular to the surface of the sample 200 (also referred to as vertical scans herein) may be taken to obtain a graphical representation of element distribution as a function of distance (in this case, distance perpendicular to the surface of the sample 200). Such scans may be used to obtain information about element distribution along the surface of the sample. For example, vertical scans may be used to probe thin dielectrics in the stack of the sample and/or oxide layers, interfaces, reaction fronts, etc. between adjacent layers.

In particular, while SEM and TEM data may provide limited information about a location of an interface between different materials (e.g., silicon oxide SEM intensity may be similar to silicon SEM intensity), EDS data may ensure a much higher degree of spatial resolution. For example, presence of oxygen atoms in the silicon oxide layers may determine a location of the silicon oxide/silicon interface in the sample).

In some embodiments, there may be an additional (and undesired) oxidation that forms between layers that may affect contact resistance. In some embodiments, there may be a need to have a via though the stack of the sample 200 (e.g., to establish a contact to a given layer, such as an electrical contact, an optical contact, a mechanical contact, or the like), but there may be oxidation at the bottom of the via which could lead to poor contact. EDS data may provide accurate information about the thickness of the oxidation layer, the speed of formation of such layers, etc. Based on such information, processing models may be adjusted to account for oxidation dynamics much more accurately than the models that are based only on TEM and/or SEM data.

In addition to the determining a chemical composition and physical location of the surfaces and interfaces, vertical scans perpendicular to the surface of the sample 200 may be used to probe a variability of film thickness across the surface by moving the scanning regions across the surface of the sample 200. This may be advantageous especially when a thin film is to be deposited on a rough surface (e.g., including features on the order of the thickness of the thin film, trenches, curvatures, etc.).

In some implementations, EDS data may be used in conjunction with TEM data. For example, while EDS data provides individual atom densities, TEM data may serve as a locational reference for the EDS data. In other words, TEM data may be used to point to a location of the sample to which the EDS data corresponds. In each of these examples, among others, TEM images and scans alone may not have sufficient capability to identify the presence of spurious materials, such as defects, impurities, halide inclusions, and the like. Further, TEM images and scans may not have sufficient resolution to reveal thin layers, such as oxidation or nitriation, dielectrics, deposited material, interfaces, etc. Nonetheless, SEM or TEM images may identify prominent reference features (e.g., a side of the substrate, a prominent ridge or groove in the substrate, or any other suitable feature) that may be used to direct the EDS scanner to the locations of the sample that are to be scanned.

As discussed above, a manufacturing process for the sample 200 (or any other sample) may utilize one or more models that predict changes in the physical state of the sample 200 that are caused by one or more process operations within a processing chamber. Individual element information provided by EDS data may be used as initial inputs (starting points) to build a model. In some embodiments, one or more experiments may be performed for which the physical outputs are to be modeled. Both TEM data and EDS data may be obtained during actual technological process or from test processing. Data corresponding to specific elements of interest may be selected from the EDS data. In some embodiments, all or most of the raw EDS data may be retained, which allows the information to be accessed at any later point in time, for additional tuning of the models. Measurements for individual elements may be obtained using EDS line scans, from which relevant parameters (e.g., thickness, chemical composition, oxidation, etc.) may be extracted. For example, if there is oxidation between two films, and oxygen peak will be apparent, and the thickness of the oxide layer may be extracted as the FWHM thickness. EDS line scans may be swept across the sample, in the directions that are parallel or perpendicular (or both) to the surface of the sample, or at some angle to the surface. By performing line scans using (e.g., rectangular) scanning regions as described above, features such as thickness of deposited films, element inclusion, etc. may be averaged to accurately determine thickness, concentration, etc.

Additionally, the physical model that is built using EDS elemental maps may be validated by obtaining additional EDS data for new samples (e.g., whose EDS data have not been used to initially build the physical model). The physical model may be used to predict a physical change to the new sample due to a processing operation. The new sample may undergo the processing operation, and actual EDS data corresponding to the actual processing operation may be obtained. The actual EDS data may be compared with the prediction of the physical model. Any discrepancies may be used to determine and/or update parameters of the physical model. The described process may be directly integrated into a modeling software.

Figure 4:
FIG. 4 is a flow diagram of a method of using EDS elemental maps to create process models, according to one embodiment.
Figure 4:
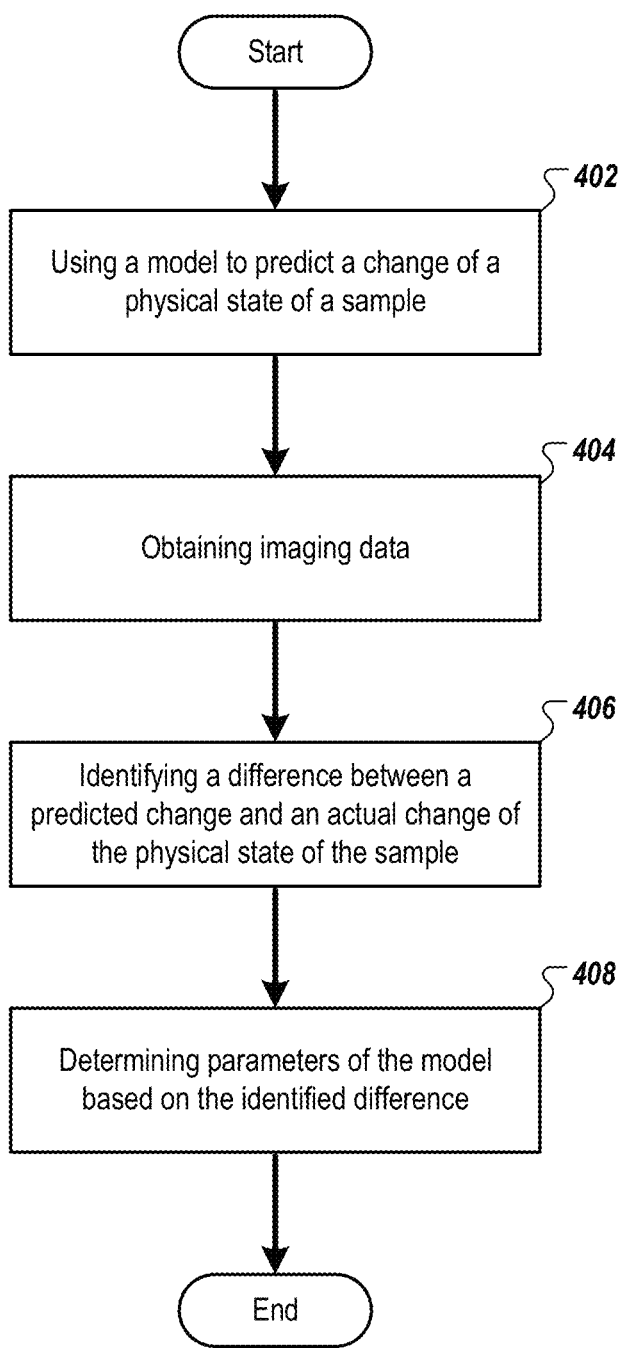

FIG. 4 is a flow diagram of a method 400 of using EDS elemental maps to create process models, according to one embodiment. The method 400 may be performed by a processing logic comprising hardware, firmware, or any combination thereof. The method 400 begins by the processing logic using a model to predict a change of a physical state of a sample caused by one or more stages of a technological process in a substrate processing apparatus (block 402). The one or more stages of the technological process may be at least one of a deposition stage (adding one or more materials to the sample), etching stage (e.g., chemical removal of one or more materials from the sample), removal stage (e.g., mechanical removal of materials from the sample), or an oxidation stage. To predict the change of the physical state of the sample, the model may predict one or more changes to dimensions of the sample caused by the one or more stages of the technological process.

The processing logic obtains imaging data associated with an actual performance of the one or more stages of the technological process (block 404). The imaging data includes a distribution of one or more chemical elements for a number of regions of the sample. In particular, the imaging data includes EDS data for the number of regions of the sample. The distribution of the one or more chemical elements characterizes a density of the one or more chemical elements within a subset of the number of regions of the sample. The subset includes i) one or more regions oriented perpendicular to a surface of the sample and/or ii) one or more regions oriented parallel to a surface of the sample. The one or more chemical elements includes at least one of a first material deposited on the sample during a deposition process or a second material applied to the sample during an etching process. In some embodiments, the imaging data further includes at least one of TEM data or SEM data.

The processing logic identifies, based on the imaging data, a difference between the predicted change of the physical state of the sample and an actual change of the physical state of the sample caused by the actual performance of the one or more stages of the technological process (block 406). To identify the difference, the processing logic uses the model to predict a first deposition rate for a first material during a deposition stage of the one or more stages of the technological process and determines a change of a thickness of the sample during the actual performance of the deposition stage. To determine the parameters of the model, the processing logic adjusts the parameters of the model in view of the predicted deposition rate and the determined change of the thickness of the sample. In some embodiments, the processing logic applies the model to predict a second deposition rate for the first material deposited on a subsequent sample with a thickness different from the thickness of the sample. In some embodiments, the processing logic applies the model to predict a second deposition rate for a second material, different from the first material, deposited on a subsequent sample. In further embodiments, to identify the difference, the processing logic identifies, based on the imaging data, a location of at least one of i) a surface of a first material or ii) an interface between the first material and another material (e.g., a material on which the first material is deposited, or a material which is deposited onto the first material).

The processing logic determines parameters of the model based on the identified difference (block 408); the method 400 ends.

Figure 5:
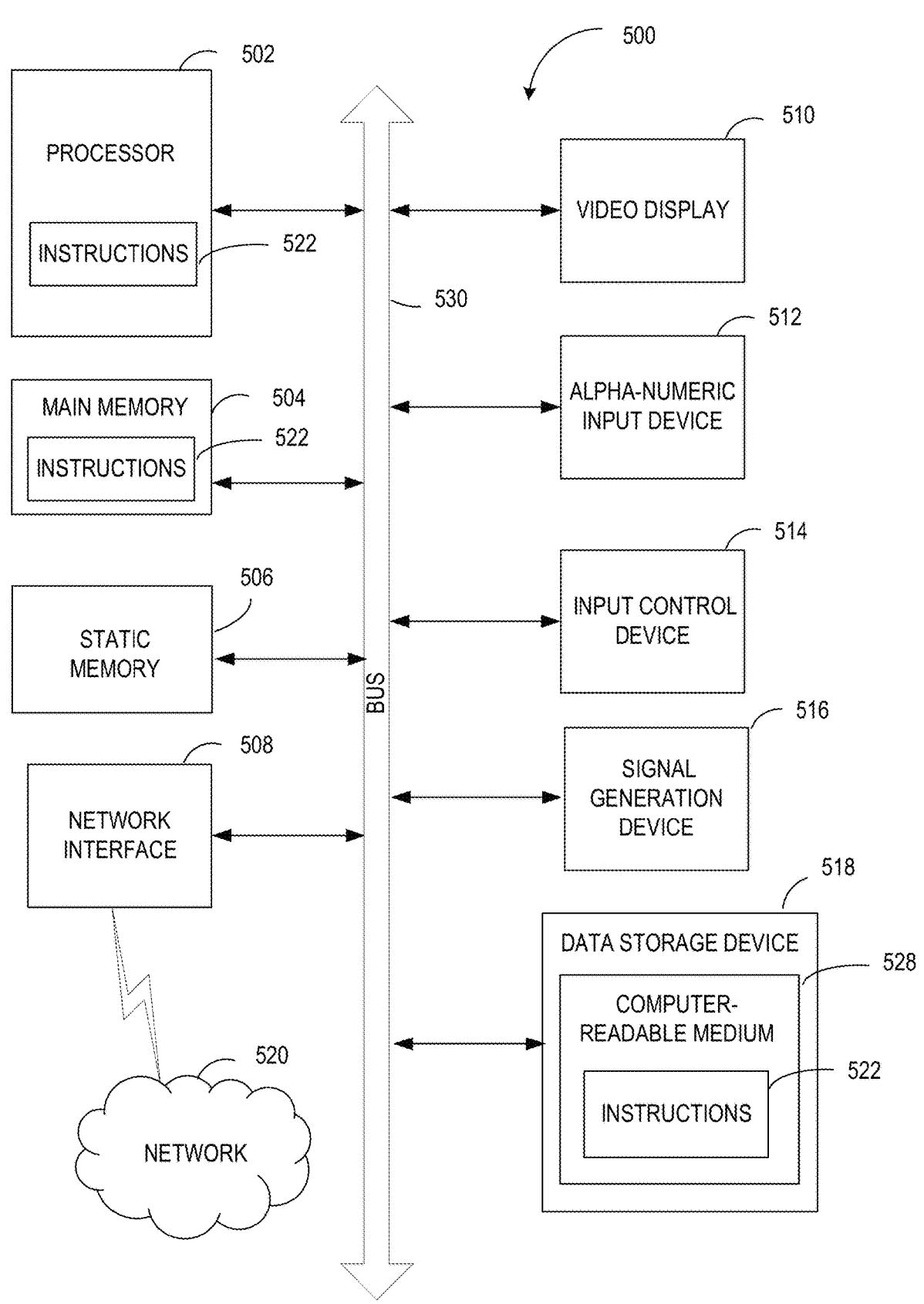
FIG. 5 depicts a block diagram of an example processing device operating in accordance with one or more aspects of the present disclosure.

FIG. 5 depicts a block diagram of an example processing device 500 operating in accordance with one or more aspects of the present disclosure. Example processing device 500 may be connected to other processing devices in a local area network (LAN), an intranet, an extranet, and/or the Internet. The processing device 500 may be a personal computer (PC), a set-top box (STB), a server, a network router, switch or bridge, or any device capable of executing a set of instructions (sequential or otherwise) that specify actions to be taken by that device. Further, while only a single example processing device is illustrated, the term "processing device" shall also be taken to include any collection of processing devices (e.g., computers) that individually or jointly execute a set (or multiple sets) of instructions to perform any one or more of the methods discussed herein.

Example processing device 500 may include a processor 502 (e.g., a CPU), a main memory 504 (e.g., read-only memory (ROM), flash memory, dynamic random access memory (DRAM) such as synchronous DRAM (SDRAM), etc.), a static memory 506 (e.g., flash memory, static random access memory (SRAM), etc.), and a secondary memory (e.g., a data storage device 518), which may communicate with each other via a bus 530.

Processor 502 represents one or more general-purpose processing devices such as a microprocessor, central processing unit, or the like. More particularly, processor 502 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 502 may also be one or more special-purpose processing devices such as an application specific integrated circuit (ASIC), a field programmable gate array (FPGA), a digital signal processor (DSP), network processor, or the like. In accordance with one or more aspects of the present disclosure, processor 502 may be configured to execute instructions implementing method 400 of thickness variation mapping.

Example processing device 500 may further comprise a network interface device 508, which may be communicatively coupled to a network 520. Example processing device 500 may further comprise a video display 510 (e.g., a liquid crystal display (LCD), a touch screen, or a cathode ray tube (CRT)), an alphanumeric input device 512 (e.g., a keyboard), an input control device 514 (e.g., a cursor control device, a touch-screen control device, a mouse), and a signal generation device 516 (e.g., an acoustic speaker).

Data storage device 518 may include a computer-readable storage medium (or, more specifically, a non-transitory computer-readable storage medium) 528 on which is stored one or more sets of executable instructions 522. In accordance with one or more aspects of the present disclosure, executable instructions 522 may comprise executable instructions implementing method 400 of thickness variation mapping.

Executable instructions 522 may also reside, completely or at least partially, within main memory 504 and/or within processor 502 during execution thereof by example processing device 500, main memory 504 and processor 502 also constituting computer-readable storage media. Executable instructions 522 may further be transmitted or received over a network via network interface device 508.

While the computer-readable storage medium 528 is shown in FIG. 5 as a single medium, the term "computer-readable storage medium" should be taken to include a single medium or multiple media (e.g., a centralized or distributed database, and/or associated caches and servers) that store the one or more sets of operating instructions. The term "computer-readable storage medium" shall also be taken to include any medium that is capable of storing or encoding a set of instructions for execution by the machine that cause the machine to perform any one or more of the methods described herein. The term "computer-readable storage medium" shall accordingly be taken to include, but not be limited to, solid-state memories, and optical and magnetic media.

It should be understood that the above description is intended to be illustrative, and not restrictive. Many other implementation examples will be apparent to those of skill in the art upon reading and understanding the above description. Although the present disclosure describes specific examples, it will be recognized that the systems and methods of the present disclosure are not limited to the examples described herein, but may be practiced with modifications within the scope of the appended claims. Accordingly, the specification and drawings are to be regarded in an illustrative sense rather than a restrictive sense. The scope of the present disclosure should, therefore, be determined with reference to the appended claims, along with the full scope of equivalents to which such claims are entitled.

The embodiments of methods, hardware, software, firmware or code set forth above may be implemented via instructions or code stored on a machine-accessible, machine readable, computer accessible, or computer readable medium which are executable by a processing element. "Memory" includes any mechanism that provides (i.e., stores and/or transmits) information in a form readable by a machine, such as a computer or electronic system. For example, "memory" includes random-access memory (RAM), such as static RAM (SRAM) or dynamic RAM (DRAM); ROM; magnetic or optical storage medium; flash memory devices; electrical storage devices; optical storage devices; acoustical storage devices, and any type of tangible machine-readable medium suitable for storing or transmitting electronic instructions or information in a form readable by a machine (e.g., a computer).

Reference throughout this specification to "one embodiment" or "an embodiment" means that a particular feature, structure, or characteristic described in connection with the embodiment is included in at least one embodiment of the disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment, embodiment, and/or other exemplarily language does not necessarily refer to the same embodiment or the same example, but may refer to different and distinct embodiments, as well as potentially the same embodiment.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an embodiment" or "one embodiment" throughout is not intended to mean the same embodiment or embodiment unless described as such. Also, the terms "first, " "second," "third," "fourth," etc. as used herein are meant as labels to distinguish among different elements and may not necessarily have an ordinal meaning according to their numerical designation.

What is claimed is:

1. A method comprising:
using a model to predict a change of a physical state of a sample caused by one or more stages of a technological process in a substrate processing apparatus;
obtaining, based at least on imaging data comprising x-ray energy-dispersive spectroscopy (EDS) data associated with an actual performance of the one or more stages of the technological process that form one or more surfaces of a first material, the density distribution for a plurality of regions of the sample, comprising:

a first spatially-resolved density of the first material, and a second spatially-resolved density of a second material, wherein the second material comprises an etch material deployed as part of the one or more stages of the technological process;

identifying, based at least on the density distribution, a difference between the predicted change of the physical state of the sample and an actual change of the physical state of the sample caused by the actual performance of the one or more stages of the technological process; and determining parameters of the model based on the identified difference.

2. The method of claim 1, wherein the one or more stages of the technological process comprise at least one of a deposition stage, an etching stage, a material removal stage, or an oxidation stage.

3. The method of claim 1, wherein to predict the change of the physical state of the sample, the model is to predict one or more changes to dimensions of the sample caused by the one or more stages of the technological process.

4. The method of claim 1, wherein the imaging data further comprises at least one of transmission electron microscopy (TEM) data or scanning electron microscopy (SEM) data.

5. The method of claim 1, wherein the plurality of regions of the sample comprise one or more regions oriented perpendicular to at least one surface of the one or more surfaces of the first material.

6. The method of claim 1, wherein the plurality of regions of the sample, comprise one or more regions oriented parallel to at least one surface of the one or more surfaces of the first material.

7. The method of claim 1, wherein the first material is deposited on the sample during a deposition stage of the one or more stages of the technological process.

8. The method of claim 1, wherein identifying the difference between the predicted change of the physical state of the sample and the actual change of the physical state of the sample comprises:

using the model to predict a first deposition rate for the first material during a deposition stage of the one or more stages of the technological process; and determining a change of a thickness of the sample during the actual performance of the deposition stage;

wherein determining the parameters of the model comprises:

adjusting the parameters of the model in view of the predicted first deposition rate and the determined change of the thickness of the sample.

9. The method of claim 8, further comprising:

applying the model to predict a second deposition rate for the first material deposited on a subsequent sample, the subsequent sample having a thickness different from the thickness of the sample.

10. The method of claim 8, further comprising:

applying the model to predict a second deposition rate for a third material deposited on a subsequent sample, the third material being different from the first material.

11. The method of claim 1, wherein identifying the difference between the predicted change of the physical state of the sample and the actual change of the physical state of the sample comprises:

identifying, based on the imaging data, a location of at least one of surface of the one or more surfaces of the first material.

12. The method of claim 1, further comprising:

using a set of historical imaging data and the imaging data as input into a machine-learning model;

obtaining one or more outputs of the machine-learning model, the one or more outputs indicating a reliability classification of the imaging data;

determining that the reliability classification is unexpected; and adjusting the parameters of the model.

13. The method of claim 1, further comprising:

using the determined parameters of the model to obtain a prediction for a subsequent technological process in the substrate processing apparatus;

processing the obtained prediction using a machine-learning model; and validating the determined parameters of the model based on an output of the machine-learning model indicating that the obtained prediction is realistic.

14. A non-transitory computer-readable storage medium comprising instructions that, when executed by a processing device, cause the processing device to:

use a model to predict a change of a physical state of a sample caused by one or more stages of a technological process in a substrate processing apparatus;

obtain, based at least on imaging data comprising x-ray energy-dispersive spectroscopy (EDS) data associated with an actual performance of the one or more stages of the technological process that form one or more surfaces of a first material, density distribution for a plurality of regions of the sample, comprising:

a first spatially-resolved density of the first material, and a second spatially-resolved density of a second material, wherein the second material comprises an etch material deployed as part of the one or more stages of the technological process;

identify, based at least on the density distribution, a difference between the predicted change of the physical state of the sample and an actual change of the physical state of the sample caused by the actual performance of the one or more stages of the technological process; and determine parameters of the model based on the identified difference.

15. The non-transitory computer-readable storage medium of claim 14, wherein to predict the change of the physical state of the sample, the model is to predict one or more changes to dimensions of the sample caused by the one or more stages of the technological process.

16. The non-transitory computer-readable storage medium of claim 14, wherein the imaging data comprises x-ray energy-dispersive spectroscopy (EDS) data for the plurality of regions of the sample.

17. The non-transitory computer-readable storage medium of claim 16, wherein the imaging data further comprises at least one of transmission electron microscopy (TEM) data or scanning electron microscopy (SEM) data.

18. The non-transitory computer-readable storage medium of claim 14, wherein to identify the difference between the predicted change of the physical state of the sample and the actual change of the physical state of the sample, the processing device is further to:

use the model to predict a deposition rate for a first material during a deposition stage of the one or more stages of the technological process; and determine a change of a thickness of the sample during the actual performance of the deposition stage; and wherein to determine the parameters of the model, the processing device is further to:

adjust the parameters of the model in view of the predicted deposition rate and the determined change of the thickness of the sample.

19. A system comprising:

a memory; and a processing device, communicatively coupled to the memory, the processing device to:

use a model to predict a change of a physical state of a sample caused by one or more stages of a technological process in a substrate processing apparatus;

obtain, based at least on imaging data comprising x-ray energy-dispersive spectroscopy (EDS) data associated with an actual performance of the one or more stages of the technological process that form one or more surfaces of a first material, density distribution for a plurality of regions of the sample, comprising:

a first spatially-resolved density of the first material, and a second spatially-resolved density of a second material, wherein the second material comprises an etch material deployed as part of the one or more stages of the technological process;

identify, based at least on the density distribution, a difference between the predicted change of the physical state of the sample and an actual change of the physical state of the sample caused by the actual performance of the one or more stages of the technological process; and determine parameters of the model based on the identified difference.

20. The system of claim 19, wherein the one or more stages of the technological process comprise at least one of a deposition stage, an etching stage, a material removal stage, or an oxidation stage.

21. The system of claim 19, wherein the plurality of regions of the sample, comprise one or more regions oriented parallel or perpendicular to at least one surface of the one or more surfaces of the first material.

* * * * *